US009627318B2

(12) United States Patent
Lin et al.

(10) Patent No.: US 9,627,318 B2
(45) Date of Patent: Apr. 18, 2017

(54) INTERCONNECT STRUCTURE WITH FOOTING REGION

(71) Applicant: TAIWAN SEMICONDUCTOR MANUFACTURING COMPANY LTD., Hsinchu (TW)

(72) Inventors: Ling Mei Lin, Tainan (TW); Chun Li Wu, Tainan (TW); Yu-Pin Chang, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 228 days.

(21) Appl. No.: 14/305,356

(22) Filed: Jun. 16, 2014

(65) Prior Publication Data

US 2015/0364420 A1   Dec. 17, 2015

(51) Int. Cl.
*H01L 23/528* (2006.01)
*H01L 23/532* (2006.01)
*H01L 21/768* (2006.01)
*H01L 23/00* (2006.01)
*H01L 23/485* (2006.01)
*H01L 23/522* (2006.01)

(52) U.S. Cl.
CPC .... *H01L 23/5283* (2013.01); *H01L 21/76805* (2013.01); *H01L 21/76808* (2013.01); *H01L 21/76816* (2013.01); *H01L 23/485* (2013.01); *H01L 23/5226* (2013.01); *H01L 23/53295* (2013.01); *H01L 24/05* (2013.01); *H01L 23/5329* (2013.01); *H01L 23/53238* (2013.01); *H01L 2224/48091* (2013.01); *H01L 2224/48453* (2013.01); *H01L 2924/13091* (2013.01)

(58) Field of Classification Search
CPC ............. H01L 23/5283; H01L 23/5226; H01L 23/485; H01L 23/5222; H01L 23/5329; H01L 23/53295; H01L 21/7682; H01L 21/76814; H01L 21/76816; H01L 21/76831; H01L 21/31116; H01L 21/76877; H01L 21/76897
See application file for complete search history.

(56) References Cited

U.S. PATENT DOCUMENTS 6,028,363 A * 2/2000 Lin ...................... H01L 23/5226
                                                  257/773
7,172,980 B2 * 2/2007 Torres .................. H01L 21/7682
                                                  257/E21.581

(Continued)

*Primary Examiner* — Michael Trinh
(74) *Attorney, Agent, or Firm* — WPAT, P.C., Intellectual Property Attorneys; Anthony King

(57) ABSTRACT

In some embodiments, an interconnect structure includes a base layer, a plurality of dielectric layers and a conductive structure. The base layer includes a conductive region. The plurality of dielectric layers are formed over the base layer. The plurality of dielectric layers includes a first dielectric layer and an etch stop layer under the first dielectric layer. The conductive structure includes a plug. The plug includes a central region and one or more footing regions. The footing regions are formed around the central region and formed at least partially in the first etch stop layer. A total width of the central region and one or more footing regions at a bottom level of the plurality of dielectric layers is at least about 5% more than a width of the central region at the bottom level of the plurality of dielectric layers.

20 Claims, 17 Drawing Sheets

(56) References Cited

U.S. PATENT DOCUMENTS

| | | | |
|---|---|---|---|
| 7,297,998 B2* | 11/2007 | Kim | H01L 21/76804 257/296 |
| 7,511,349 B2* | 3/2009 | Tsai | H01L 21/76804 257/382 |
| 7,517,736 B2* | 4/2009 | Mehta | H01L 21/76802 257/E21.575 |
| 2004/0140563 A1 | 7/2004 | Ahn | |
| 2008/0315290 A1* | 12/2008 | Lee | H01L 21/28282 257/321 |

* cited by examiner

INTERCONNECT STRUCTURE WITH FOOTING REGION

BACKGROUND

Integrated circuit (IC) fabrication is typically divided into a front-end-of-line (FEOL) process that forms devices such as transistors, and capacitors, etc., in and/or on a substrate and other portions before deposition of a first metal layer, a back-end-of-line (BEOL) process for forming multiple metal layers and associated via plugs for interconnecting the devices, and a far BEOL process for forming bond pads between a top metal layer and chip-to-package connections or flip-chip connections. Single and/or dual damascene processes are usually used to form contact plugs in the FEOL process, the metal layers and the associated contact plugs or via plugs in the BEOL process, and the bond pads in the far BEOL process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
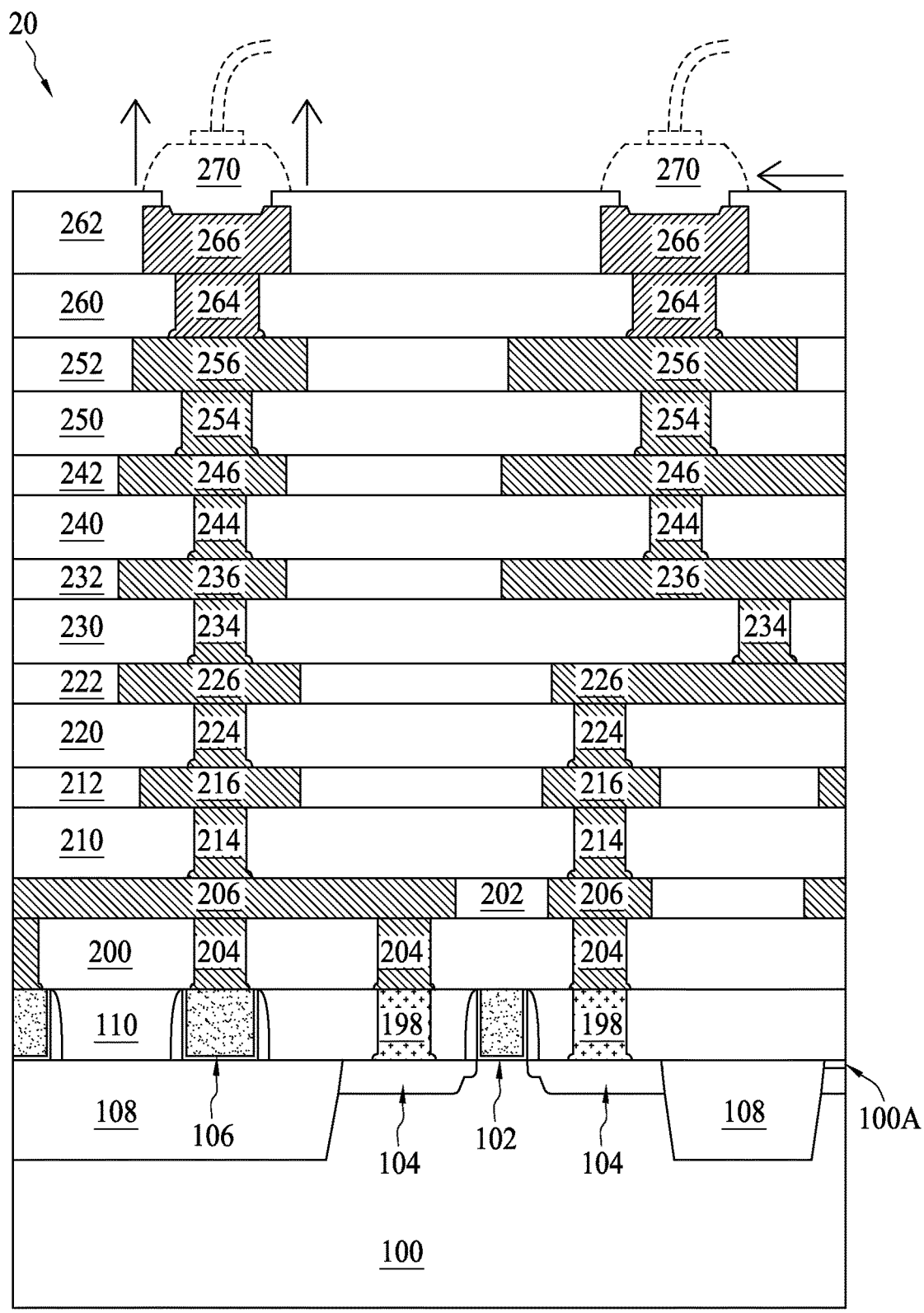
FIG. 1 is a schematic cross-sectional diagram of an integrated circuit that includes a multi-layer interconnect portion formed over a substrate in accordance with some embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "lower", "upward", "left", "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic cross-sectional diagram of an integrated circuit 10 that includes a multi-layer interconnect portion 198 to 266 formed over a substrate 100 in accordance with some embodiments. During, for example, wire bonding of the integrated circuits 10 for forming chip-to-package connections, structural impact forces such as a shear force and a pulling force can be exerted upon bonding balls 270. FIG. 1 illustrates contact plugs 198 and 204 with footing regions, via plugs 214, 224, . . . and 254 with footing regions and/or plug regions 264 of bonding pads with footing regions that increase adhesion reliability of the integrated circuits 10 against failure mechanisms such as metal lifting and pad peeling resulted from the structural impact forces.

In some embodiments, the integrated circuits 10 includes a substrate 100, a device portion 102 to 110 in and/or on the substrate 100, the multi-layer interconnect portion 198 to 266 on the device portion 102 to 110. The device portion 102 to 110 includes devices formed on and/or in the substrate 100, dielectric isolation regions 108 formed between the devices, and a stack of dielectric layers 110 formed on a level 100A at a top surface of the substrate 100. The multi-layer interconnect portion 198 to 266 includes contact plugs 198 formed in a layer in which the stack of dielectric layers 110 reside; contact plugs 204 and a stack of dielectric layers 200 formed on a layer in which the contact plugs 198 reside; metal layers 206, 216, . . . , and 256, via plugs 214, 224, . . . , and 254, and stacks of dielectric layers 210, 212, . . . , and 252 formed over a layer in which the contact plugs 204 resides; and bond pads each with a pad region 266 and a plug region 264, a stack of dielectric layers 260, and a passivation layer 262 formed over a layer in which the metal layer 256 resides. In some embodiments, the device portion 102 to 112 and the contact plugs 198 are formed in the FEOL process, the portions 200 to 256 in the multi-layer interconnect portion 198 to 266 are formed in the BEOL process, and the portions 260 to 266 in the multi-layer interconnect portion 198 to 266 are formed in the far BEOL process.

In some embodiments, the substrate 100 is formed from a bulk semiconductor substrate. In some embodiments, the bulk semiconductor substrate is formed of an elementary semiconductor material such as silicon, germanium in a crystalline structure. In other embodiments, the bulk semiconductor substrate is formed of a compound semiconductor material such as silicon carbide, gallium arsenide, gallium phosphide, indium phosphide, indium arsenide or indium antimonide, or an alloy semiconductor material such as silicon germanium, gallium arsenide phosphide, gallium indium arsenide, gallium indium phosphide, gallium indium arsenide phosphide, or combinations thereof. In some embodiments, the bulk semiconductor substrate is doped with p-type dopants such as boron (B). In some embodiments, portions of the bulk semiconductor substrate are removed to form the substrate 100. For example, trenches are formed in the bulk semiconductor substrate to accommodate the dielectric isolation regions 108. In other embodiments, the substrate 100 is formed from a semiconductor-on-insulator (SOI) substrate instead of the bulk semiconductor substrate.

In some embodiments, the dielectric isolation regions 108 are shallow trench isolations (STIs) formed in the trenches of the bulk semiconductor substrate. A top surface of the dielectric isolation regions 108 is at the same level as the level 100A at the top surface of the substrate 100. In some embodiments, the dielectric isolation regions 108 includes silicon oxide, silicon nitride, silicon oxy-nitride, fluoride-doped silicate (FSG), and/or a suitable low-k dielectric material.

In some embodiments, the devices include portions formed below the level 100A at the top surface of the substrate 100, and portions formed above the level 100A. For example, a MOSFET device includes a gate stack 102 formed on the top surface of the substrate 100, and source and drain regions 104 formed in the substrate 100 on opposite sides of the gate stack 102. For another example, gate stacks 106 of other MOSFET devices cross over the top surface of the dielectric isolation region 108.

In some embodiments, the stack of dielectric layers 110 is formed on the level 100A at the top surface of the substrate 100 to surround the gate stacks 102 and 106. In some embodiments, contact openings are formed in the stack of dielectric layers 110 to expose the source and drain regions 104. The contact plugs 198 are formed in the contact openings. Each contact plug 198 has the footing regions that enlarge an adhesion interface between the contact plug 198 and the source or drain region 104, and between the contact plug 198 and the stack of dielectric layers 110.

In some embodiments, the stack of dielectric layers 200 and the stack of dielectric layers 202 are formed on the layer in which the contact plugs 198 reside. In some embodiments, dual-damascene openings are formed in the stacks of dielectric layers 200 and 202 to expose the gate stacks 106 and the contact plugs 198. The metal layer 206 and the contact plugs 204 are formed in the dual-damascene openings. Each contact plug 204 has the footing regions that enlarge an adhesion interface between the contact plug 204 and the gate stack 106 or the contact plug 198, and between the contact plug 204 and the stack of dielectric layers 200. More details of the devices, the contact plugs 198, the contact plugs 204, and the stack of dielectric layers 110 and 200 will be described with reference to FIG. 5.

In some embodiments, the stack of dielectric layers 210 and the stack of dielectric layers 212 are formed on a layer in which the metal layer 206 resides. In some embodiments, dual-damascene openings are formed in the stacks of dielectric layers 210 and 212 to expose portions of the metal layer 206. The metal layer 216 and the via plugs 214 are formed in the dual-damascene openings. Each via plug 214 has the footing regions that enlarge an adhesion interface between the via plug 214 and the metal layer 206, and between the via plug 214 and the stack of dielectric layers 210. Other stacks of dielectric layers 220 and 222, 230 and 232, . . . , or 250 and 252, metal layer 226, 236, . . . , or 256, and via plugs 224, 234, . . . , or 254 are similar to the stacks of dielectric layers 210 and 212, the metal layer 216 and the via plugs 214 described, respectively. More details of the metal layer 226, the via plug 224 and the stacks of dielectric layers 220 and 222 will be described with reference to FIG. 4.

In some embodiments, the stack of dielectric layers 260 is formed on a layer in which the metal layer 256 resides. In some embodiments, via openings are formed in the stack of dielectric layers 260 to expose portions of the metal layer 256. Each via opening are filled such that the plug region 264 of the bond pad is formed in the via opening, and a layer to be patterned into the pad region 266 is formed above the plug region 264. The passivation layer 262 is formed to cover portions of the pad region 266. Each plug region 264 has the footing regions that enlarge an adhesion interface between the plug region 264 and the metal layer 256, and between the plug region 264 and the stack of dielectric layers 260. More details of the bond pads, the stack of dielectric layers 260, and the passivation layer 262 will be described with reference to FIG. 2 and FIG. 3.

In some embodiments, during wire bonding of the integrated circuits 10 for forming chip-to-package connections, a bonding ball 270 such as a solder ball is formed over the pad region 266 of the bonding pad. A wire bond attached to the bonding ball 270 is used to connect the integrated circuits 10 to an external package. During wire bonding, structural impact forces such as a shear force and a pulling force can be exerted upon the bonding balls 270. The shear force is exemplarily shown as a leftward arrow next to the bonding ball 270 on the right. The pulling force is exemplarily shown as upward arrows next to the bonding ball on the left. With the footing regions in the plug region 264 of the bond pad, the adhesion interface of the plug region 264 is enlarged and is more resilient to pad peeling. With the footing regions in the contact plug 198 or 204 or the via plug 214, 224, . . . , or 254, the adhesion interface of the contact plug 198 or 204 or the via plug 214, 224, . . . , or 254 is expanded and is more resilient to metal lifting.

Applying the multi-layer interconnection portion with footing regions to enhance resilience to impact forces during wire bonding of the integrated circuits 10 is exemplary. The footing regions can similarly enhance resilience to impact forces during, for example, flip-chip bonding.

Figure 2:
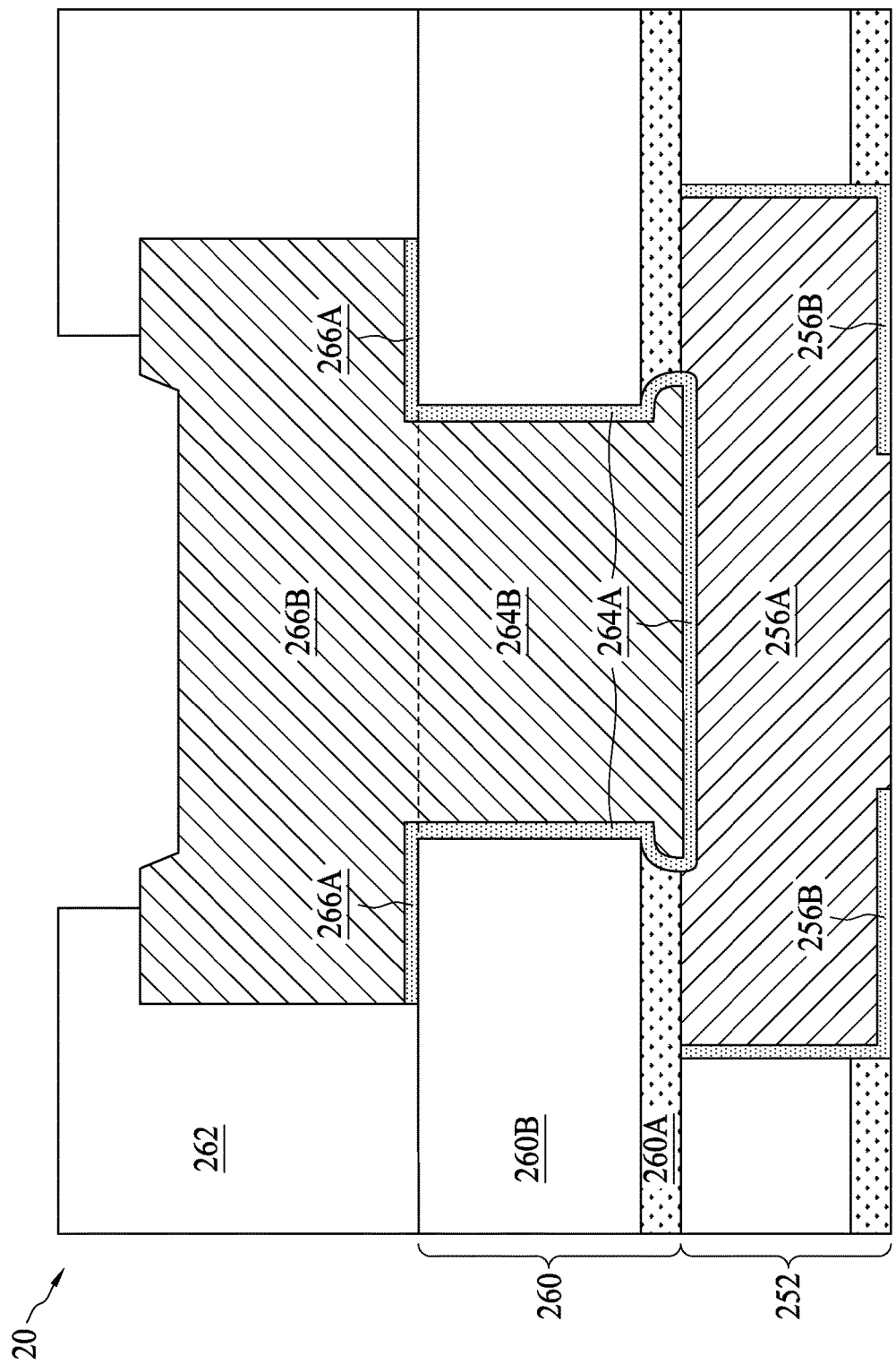
FIG. 2 is a schematic cross-sectional diagram of an interconnect structure in the multi-layer interconnect portion in FIG. 1 in accordance with some embodiments.

FIG. 2 is a schematic cross-sectional diagram of an interconnect structure 20 in the multi-layer interconnect portion 198 to 266 in FIG. 1 in accordance with some embodiments. FIG. 2 illustrates the bond pad with the pad region 266 and the plug region 264 in FIG. 1 and the adhesion interface of the plug region 264. The interconnect structure 20 includes a base layer in which the metal layer 256 resides, the stack of dielectric layers 260, the bond pad with the pad region 266 and the plug region 264, and the passivation layer 262.

In some embodiments, the base layer in which the metal layer 256 resides includes the stack of dielectric layers 252 and the metal layer 256 embedded in the stack of dielectric layers 252. The metal layer 256 includes a diffusion barrier layer 256B and a conductive layer 256A. Details of the stack of dielectric layers 252 and the metal layer 256 are similar to the stack of dielectric layers 260 described below, and the metal layer 236 to be described with reference to FIG. 4, respectively.

In some embodiments, the stack of dielectric layers 260 includes an etch stop layer 260A and a passivation layer 260B. In some embodiments, the etch stop layer 260A includes silicon carbide, silicon nitride, silicon oxy-nitride or other suitable materials. The passivation layer 260B includes silicon oxide, borophosphosilicate glass (BPSG), tetraethyl orthosilicate (TEOS), spin-on-glass (SOG), updoped silicate glass (USG), organo-silicate glass (OSG), fluorinated silicate glass (FSG), high-density plasma (HDP) oxide, plasma-enhanced TEOS (PETEOS), or other suitable materials. In some embodiments, the passivation layer 260B is formed of porous silicon oxide materials and therefore has a lower density than that of the etch stop layer 260A. In some embodiments, to enhance an adhesion strength of the stack of the dielectric layers 260, the etch stop layer 260B comprises silicon carbide, and the passivation layer 260B comprises USG or OSG. In some embodiments, the etch stop layer 260A is formed to a thickness of from about 50 to about 5000 angstroms. The term "about" used herein means greater or less than the stated value or the stated range of values by 1/10 of the stated values.

A single passivation layer 260B formed on a single etch stop layer 260A is exemplary. In other embodiments, the etch stop layer 260A is a bi-layer etch stop layer that includes an upper layer formed of silicon carbide and a lower layer formed of silicon nitride. Correspondingly, the passivation layer 260B, or similarly, an inter-metal dielectric (IMD) layer 430B to be described with reference to FIG. 4, and an inter-layer dielectric (ILD) layer 110B or 200B to be described with reference to FIG. 5 includes a lower layer formed of OSG and an upper layer formed of FSG.

In some embodiments, the bond pad includes a diffusion barrier layer having a portion 264A in the plug region 264 and a portion 266A in the pad region 266, and a conductive layer having a portion 264B in the plug region 264 and a portion 266B in the pad region 266. In some embodiments, the diffusion barrier layer is conformally formed on side walls and a bottom of the via opening described with reference to FIG. 1, and a top surface of the passivation layer 260B. The conductive layer is deposited on the diffusion barrier layer on the top surface of the passivation layer 260B and fills the via opening. The conductive layer and the diffusion barrier layer over the top surface of the passivation layer 260B are patterned into the pad region 266. The diffusion barrier layer is capable of acting as both a metal-diffusion barrier layer and an adhesive layer between the conductive layer and the passivation layer 260B. In some embodiments, the diffusion barrier layer includes tantalum (Ta), tantalum nitride (TaN), titanium (Ti), titanium nitride (TiN), or multiple layers of these materials. In some embodiments, the passivation layer 262 is formed on the stack of dielectric layers 260 and the pad region 266 of the bond pad, and exposes a portion of a top surface of the pad region 266 for bonding with the bonding ball 270. In some embodiments, the passivation layer 262 includes silicon nitride. In other embodiments, the passivation layer 262 is a laminate of silicon oxide material and silicon nitride material with the silicon nitride material formed on top of the silicon oxide material.

Figure 3:
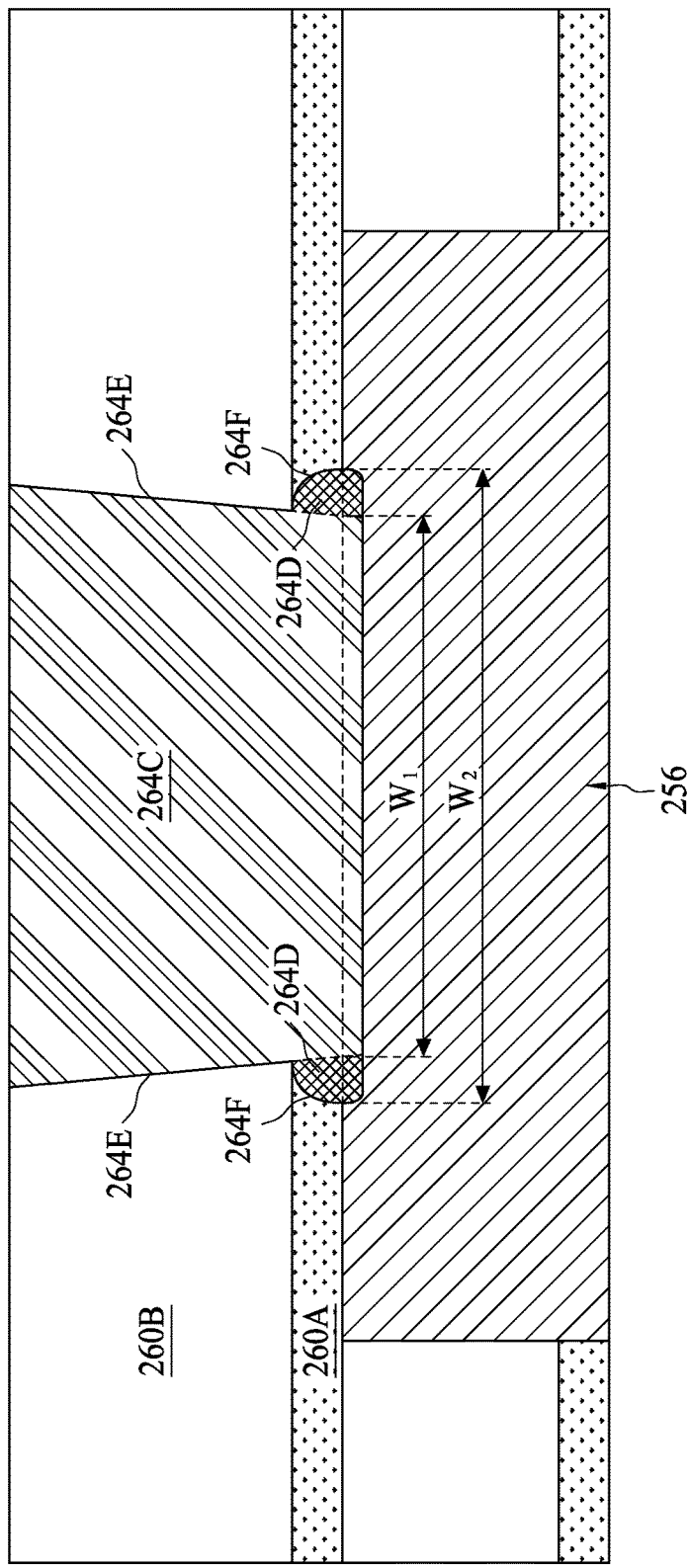
FIG. 3 is a schematic cross-sectional diagram illustrating delineated regions and profiles of a plug region in FIG. 2 in accordance with some embodiments.

FIG. 3 is a schematic cross-sectional diagram illustrating the delineated regions and profiles of the plug region 264 in FIG. 2 in accordance with some embodiments. The pad region 266 is not shown for simplicity. The plug region 264 includes a central region 264C and footing regions 264D formed on opposite sides of the central region 264C. In some embodiments, the central region 264C has a side wall profile 264E which is tapered in a downward direction. For illustration purpose, the side wall profile 264E of the central region 264 is extended to the bottom of the plug region 264. The footing regions 264D are at least partially formed in the etch stop layer 260A under the passivation layer 260B. In some embodiments, at a bottom level of the etch stop layer 260A, a total width $W_2$ of the central region 264C and the footing regions 264D is at least about 5% more than a width of the central region at the bottom level of the plurality of dielectric layers. In some embodiments, at the bottom level of the etch stop layer 260A, the total width $W_2$ of the central region 264C and the footing regions is about 5%-10% more than the width of the central region 264C. Therefore, the adhesion interface between the plug region 264 and the metal layer 256 is enlarged by the footing regions 264D. The term "width" used herein is equivalent to "critical dimension" known in the art.

The central region with a polygonal shape is exemplary. In other embodiments (not shown), a central region has an annular shape and a footing region is formed around the central region.

In some embodiments, the footing regions 264D are formed by bombarding ions scattered from an exposed surface of the metal layer 256. Therefore, each footing region 264D has a side wall profile 264F that tapers toward the central region 264C along an upward direction. Further, the footing regions 264D are etched physically by the scattered ions, and are formed at least partially in the etch stop layer 260A. In some embodiments, the footing regions 264D abut the passivation layer 260B. In some embodiments, by adopting silicon carbide to form the etch stop layer 260A, and USG or OSG to form the passivation layer 260B, the enhanced adhesion strength of the laminate of the etch stop layer 260A and the passivation layer 260B further ensures downward forces exerted upon the footing regions 264D by the passivation layer 260B and the layers above the passivation layer 260B.

Figure 4:
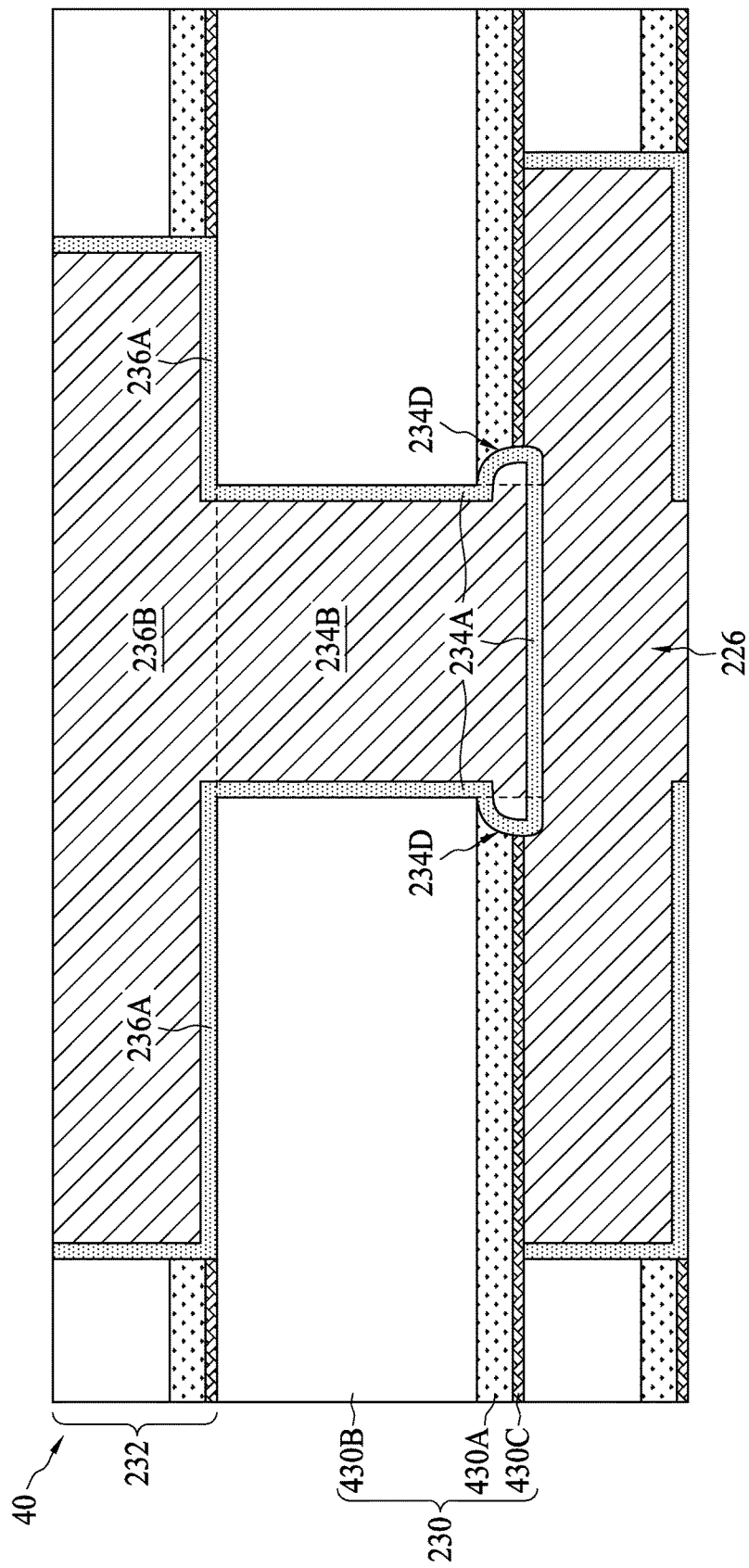
FIG. 4 is a schematic cross-sectional diagram of an interconnect structure in the multi-layer interconnect portion in FIG. 1 in accordance with some embodiments.

FIG. 4 is a schematic cross-sectional diagram of an interconnect structure 40 in the multi-layer interconnect portion 198 to 266 in FIG. 1 in accordance with some embodiments. FIG. 4 illustrates the metal layer 236 and the via plug 234 in FIG. 1 and the adhesion interface of the via plug 234. The interconnect structure 40 includes a base layer in which the metal layer 226 resides, the stack of dielectric layers 230, the stack of dielectric layers 232, the metal layer 236 and the via plug 234.

In some embodiments, the stack of dielectric layers 230 includes an adhesion promotion layer 430C, an etch stop layer 430A and an inter-metal dielectric (IMD) layer 430B. Compared to the stack of dielectric layers 260 described with reference to FIG. 2, the stack of dielectric layers 230 includes an adhesion promotion layer 430C formed between the underlying metal layer 226 and an overlying etch stop layer 430A. In some embodiments, the adhesion promotion layer 430C is formed by pre-heating a surface of the metal layer 256, followed by a pre-cleaning treatment with ammonia ($NH_3$) and $N_2$, and a treatment with $N_2$ or $O_2$ or $N_2$ with alkyl silane or alkyl silane. The nitrogen and hydrogen containing treatment for the adhesion promotion layer 430C creates metal to nitrogen bonds such as copper to nitrogen bonds between the adhesion promotion layer 430C and underlying the metal layer 256. The alkyl silane containing treatment for the adhesion promotion layer 430C creates, for example, silicon to silicon bonds between the adhesion promotion layer 430C and the overlying etch stop layer 430A. Therefore, the adhesion between the etch stop layer 430A and the metal layer 226 is enhanced by the adhesion promote layer 430C.

In some embodiments, the etch stop layer 430A includes silicon carbide, silicon nitride, silicon oxy-nitride or other suitable materials. The IMD layer 430B includes a low-k dielectric material such as silicon oxide, borophosphosilicate glass (BPSG), tetraethyl orthosilicate (TEOS), spin-on-glass (SOG), updoped silicate glass (USG), organo-silicate glass (OSG), fluorinated silicate glass (FSG), high-density plasma (HDP) oxide, plasma-enhanced TEOS (PETEOS). In some embodiments, the IMD layer 430B is formed of porous silicon oxide materials and therefore has a lower density than that of the etch stop layer 260A. In some embodiments, to enhance an adhesion strength of the stack of the dielectric layers 230, the etch stop layer 430A comprises silicon carbide, and the IMD layer 430B comprises USG or OSG. In some embodiments, the etch stop layer 430A is formed to a thickness of from about 50 to about 5000 angstroms.

In some embodiments, the metal layer 236 and the via plug 234 are formed in a dual-damascene opening formed in the stacks of dielectric layers 230 and 232 that exposes the metal layer 226. A diffusion barrier layer is conformally formed on side walls and a bottom of the dual-damascene opening, and has a portion 234A in the via plug 234 and a portion 236A in the metal layer 236. A conductive layer is deposited to fill the remaining of the dual-damascene opening and has a portion 234B in the via plug 234 and a portion 236B in the metal layer 236. The diffusion barrier layer comprises Ta, TaN, Ti, TiN, or multiple layers of these materials. The conductive layer comprises copper.

In some embodiments, the side walls of the dual-damascene opening are notched at the etch stop layer 430A and the adhesion promotion layer 430C, thereby resulting in the via plug 234 with footing regions 234D. The footing regions 234D are similar to the footing regions 264D described with reference to FIG. 3, except that an adhesion interface enhanced by the footing regions 234D is formed between the via plug 234, and the etch stop layer 430A, the adhesion promotion layer 430C and the metal layer 226.

In other embodiments, a single-damascene process that creates openings for the via plug 234 and the metal layer 236, respectively, can also be used. The portion 234B of the conductive layer comprises W, and the portion 236B of the conductive layer comprises Al.

Figure 5:
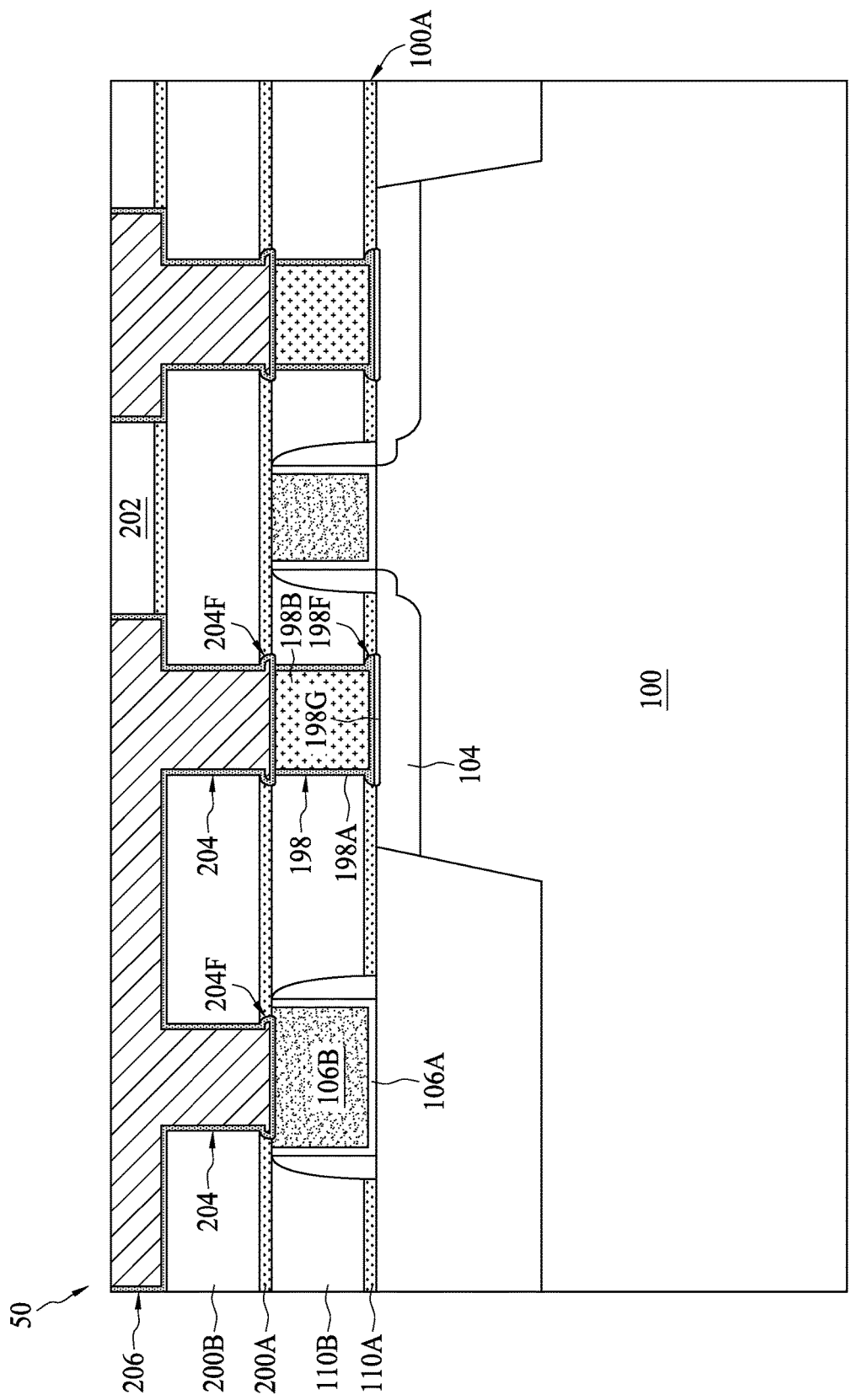
FIG. 5 is a schematic cross-sectional diagram of a structure that includes a base layer in which the source or drain region resides and a contact plug in contact with the source or drain region, and a base layer in which a gate stack or the contact plug resides, and a contact plug in contact with the gate stack or the contact plug in accordance with some embodiments.

FIG. 5 is a schematic cross-sectional diagram of a structure that includes a base layer in which the source or drain region 104 resides and a contact plug 198 in contact with the source or drain region 104, and a base layer in which a gate stack 106 or the contact plug 198 resides, and a contact plug 204 in contact with the gate stack 106 or the contact plug 198 in accordance with some embodiments.

In some embodiments, the source or drain region 104 is formed in the substrate 100. For example, for an NMOS, the source or drain region 104 is doped with n-type dopants such as arsenic (As). The stack of dielectric layers 110 is formed on the level 100A at the top surface of the substrate 100, and includes an etch stop layer 110A, and an inter-layer dielectric (ILD) layer 110B. The etch stop layer 110A and the ILD layer 110B are similar to the etch stop layer 430A and the IMD layer 430B described with reference to FIG. 1, respectively. In some embodiments, a contact opening is formed in the stack of dielectric layers 110 to expose source or drain region 104. In some embodiments, the contact plug 198 includes a silicide layer 198G, a diffusion barrier layer 198A and a conductive layer 198G. The silicide layer 198G is formed at a bottom of the contact opening. The diffusion barrier layer 198A is formed on the silicide layer 198G and side walls of the contact opening. The conductive layer 198B fills the remaining of the contact opening. The diffusion barrier layer 198A comprises Ta, TaN, Ti, TiN or multiple layers for these materials. The conductive layer 198B comprises W, Al, or Cu. The contact plug 198 includes footing regions 198F that are formed at least partially in the etch stop layer 110A, thereby enhancing an adhesion interface between the contact plug 198 and the source or drain region 104, and between the contact plug 198 and the etch stop layer 110A.

In some embodiments, for the MOSFET device, the gate stack, such as the gate stack 106 includes a gate dielectric 106A and a gate electrode 106B. The gate dielectric 106A includes a high-k dielectric material such as $HfO_2$, HfErO, HfLaO, HfYO, HfGdO, HfAlO, HfZrO, HfTiO, HMO, $ZrO_2$, $Y_2O_3$, $La_2O_5$, $Gd_2O_5$, $TiO_2$, $Ta_2O_5$, SrTiO or combinations thereof. The gate electrode 106B includes one or more work function metal layers (not illustrated) and a fill metal (not illustrated). The one or more work function metal layers are formed over the gate dielectric 106A for adjust a work function of the gate electrode 106B. The fill metal fills the remaining space of the gate stack 106 for serving as the main conductive portion of the gate electrode 106B. In some embodiments, the one or more work function metal layers include TaC, TaN, TiN, TaAlN, TaSiN or combinations thereof. In some embodiments, the fill metal include W, Al, Cu, or combinations thereof.

In some embodiments, the stack of dielectric layers 200 is formed on the base layer in which the gate stacks 106 and the contact plugs 198 reside. The stack of dielectric layers 202 is formed on the layer in which the stack of dielectric layers 200 resides. The stack of dielectric layers 200 includes an etch stop layer 200A and an ILD layer 200B. Exemplary materials of the etch stop layer 200A and the ILD layer 200B are similar to the etch stop layer 430A and the IMD layer 430B described with reference to FIG. 4, respectively. Exemplary materials of the stack of dielectric layers 202 are similar to those of the stack of dielectric layers 200.

In some embodiments, the metal layer 206 and the via plug 204 are formed in the dual-damascene opening formed in the stacks of dielectric layers 200 and 202 that exposes the gate electrode 106B or the contact plug 198. The metal layer 206 and the via plug 204 are similar to the metal layer 236 and the via plug 234 described with reference to FIG. 4, respectively. Similarly, the via plug 204 has footing regions 204F formed at least partially in the etch stop layer 200A and thereby enhancing the adhesion interface between the via plug 204, and the gate electrode 106B or the contact plug 198, and between the via plug 204 and the etch stop layer 200A.

Figure 6:
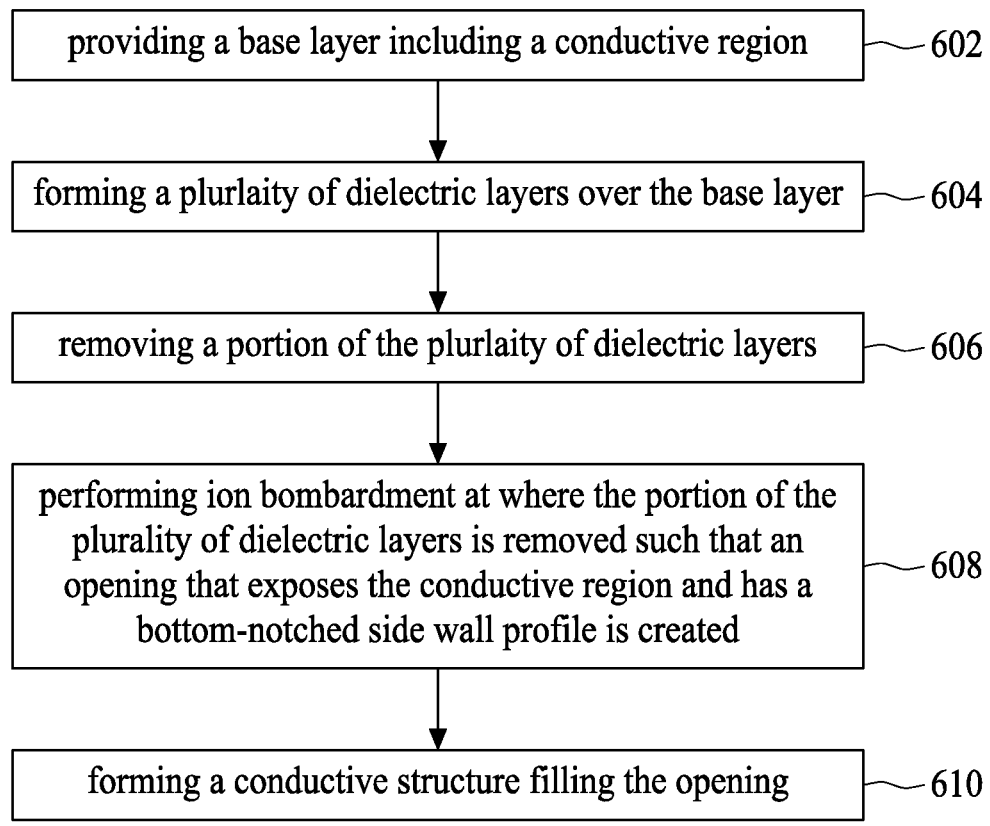
FIG. 6 is a flow diagram of a method for forming an interconnect structure in accordance with some embodiments.

FIG. 6 is a flow diagram of a method 60 for forming an interconnect structure in accordance with some embodiments. In operation 602, a base layer including a conductive region is provided. In operation 604, a plurality of dielectric layers are formed over the base layer. In operation 606, a portion of the plurality of dielectric layers is removed. In operation 608, ion bombardment is performed at where the portion of the plurality of dielectric layers is removed such that an opening that exposes the conductive region and has a bottom-notched side wall profile is created. In operation 610, a conductive structure filling the opening is formed.

Figure 7A:
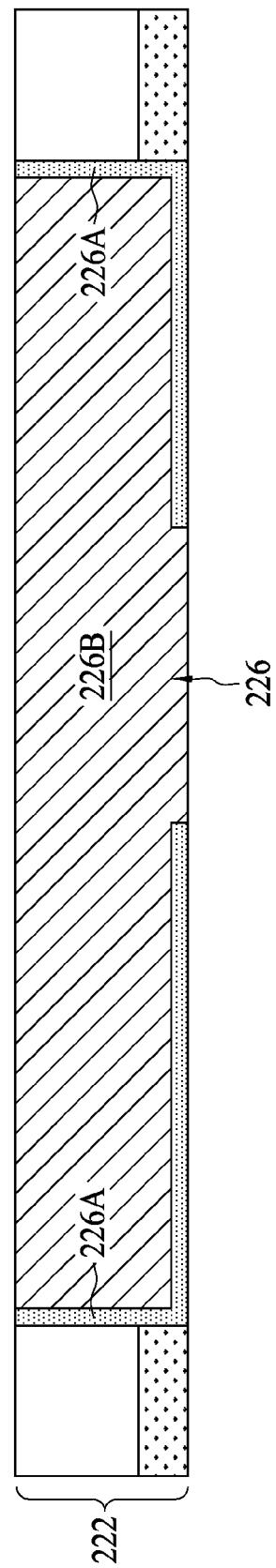
FIGS. 7A to 7I are schematic cross-sectional diagrams of structures formed by the operations or sub-operations of the method in FIG. 6 in accordance with some embodiments.

FIGS. 7A to 7I are schematic cross-sectional diagrams of structures formed by the operations or sub-operations of the method in FIG. 6 in accordance with some embodiments. In operation 602, a base layer including a conductive region is provided. In FIG. 7A, a base layer in which the metal layer 226 in FIG. 1 resides is provided. The base layer includes the stack of dielectric layers 222 and the metal layer 226 formed in the stack of dielectric layers 222. The metal layer includes the conductive layer 226B and the diffusion barrier layer 226A between the conductive layer 226B and adjacent stacks of dielectric layers such as the stack of the dielectric layers 222. The formation of the stack of dielectric layers 222 and the metal layer 226 is similar to formation of the stack of dielectric layers 232 and the metal layer 236 to be described with reference to FIGS. 7B to 7I.

Figure 7B:
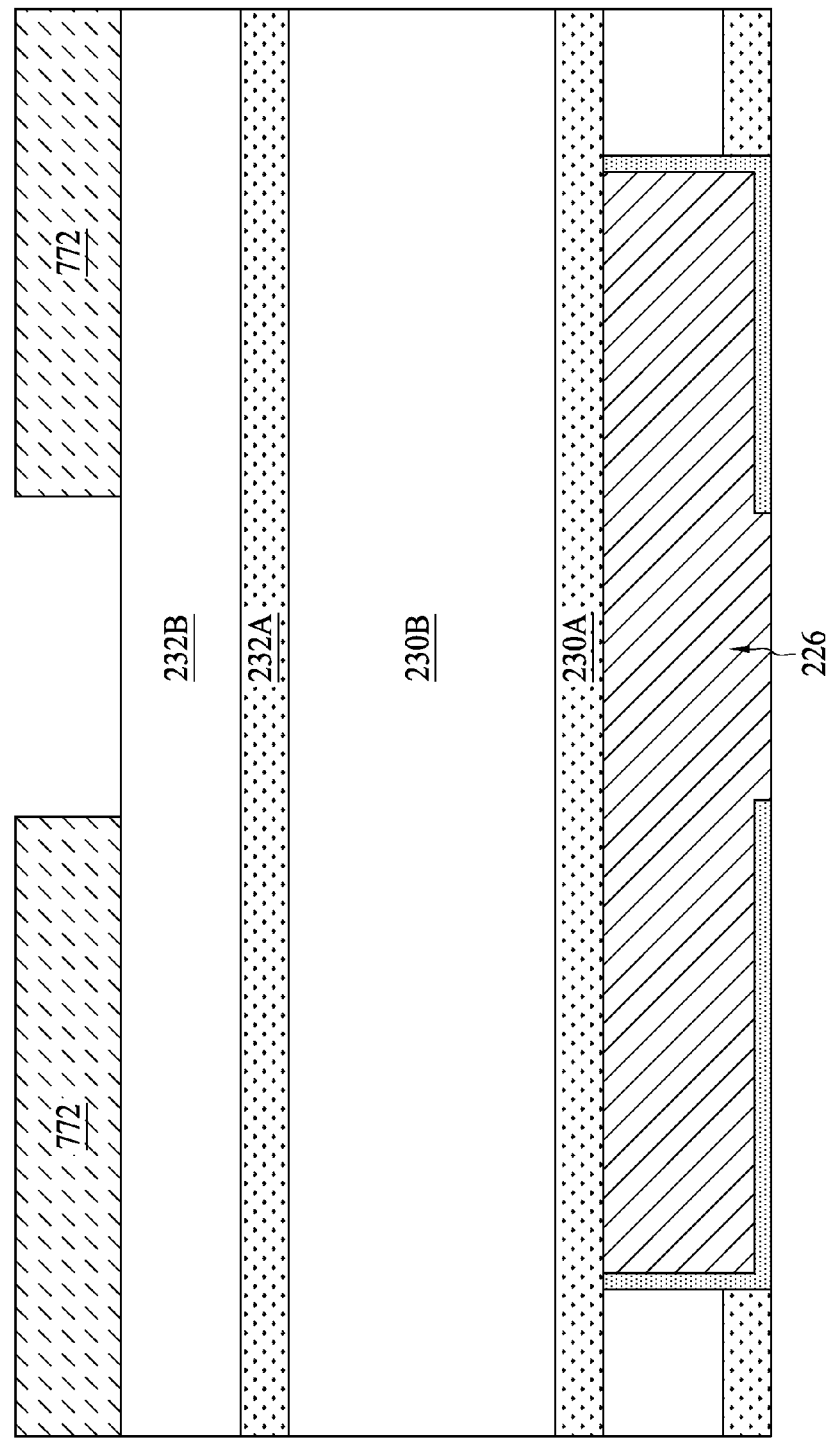

In operation 604, a plurality of dielectric layers are formed over the base layer. In FIG. 7B, an etch stop layer 230A, an ILD layer 230B, an etch stop layer 232A, and an ILD layer 232B are blanket deposited in sequence on the base layer in which the metal layer 226 resides. Exemplary materials for forming the etch stop layer 230A and 232A, and the ILD layers 230B and 232B have been described with reference to FIG. 4. In some embodiments, the etch stop layer 230A, the ILD layer 230B, the etch stop layer 232A and the ILD layer 232B are deposited using, for example, chemical vapor deposition (CVD), plasma enhanced chemical vapor deposition (PECVD), high density plasma chemical vapor deposition (HDP-CVD) and atmospheric pressure chemical vapor deposition (APCVD).

In operation 606, a portion of the plurality of dielectric layers is removed. In FIG. 7B, a photoresist layer 772 is deposited on the ILD layer 232B. Photolithography techniques are applied to pattern the photoresist layer 772 into a photoresist mask that defines an area where a via opening 774 (shown in FIG. 7C) is to be present. Then, in FIG. 7C, the pattern of the photoresist layer 772 in FIG. 7B is transferred to the underlying ILD layer 232B, etch stop layer 232A and the ILD layer 230B to form the via opening 774. The pattern of the photoresist layer 772 is transferred to the underlying layers using, for example, reactive ion etching (RIE). In some embodiments, the ILD layers 232B and 230B are etched by a process chemistry selected from the group of consisting of $CF_4$, $CHF_3$, $CH_2F_2$, $C_4F_8$, $C_5F_8$ and $C_4F_6$, and is combined with ambient gas mixture selected from the group consisting of Ar, $O_2$, $N_2$, CO and He. The etch stop layer 232A is etched by a plasma of $CF_4/H_2$ gases. In other embodiments, the etch stop layer 232A is etched using the same technique as the etch stop layer 230A to be described with reference to FIG. 7F.

Figure 7C:
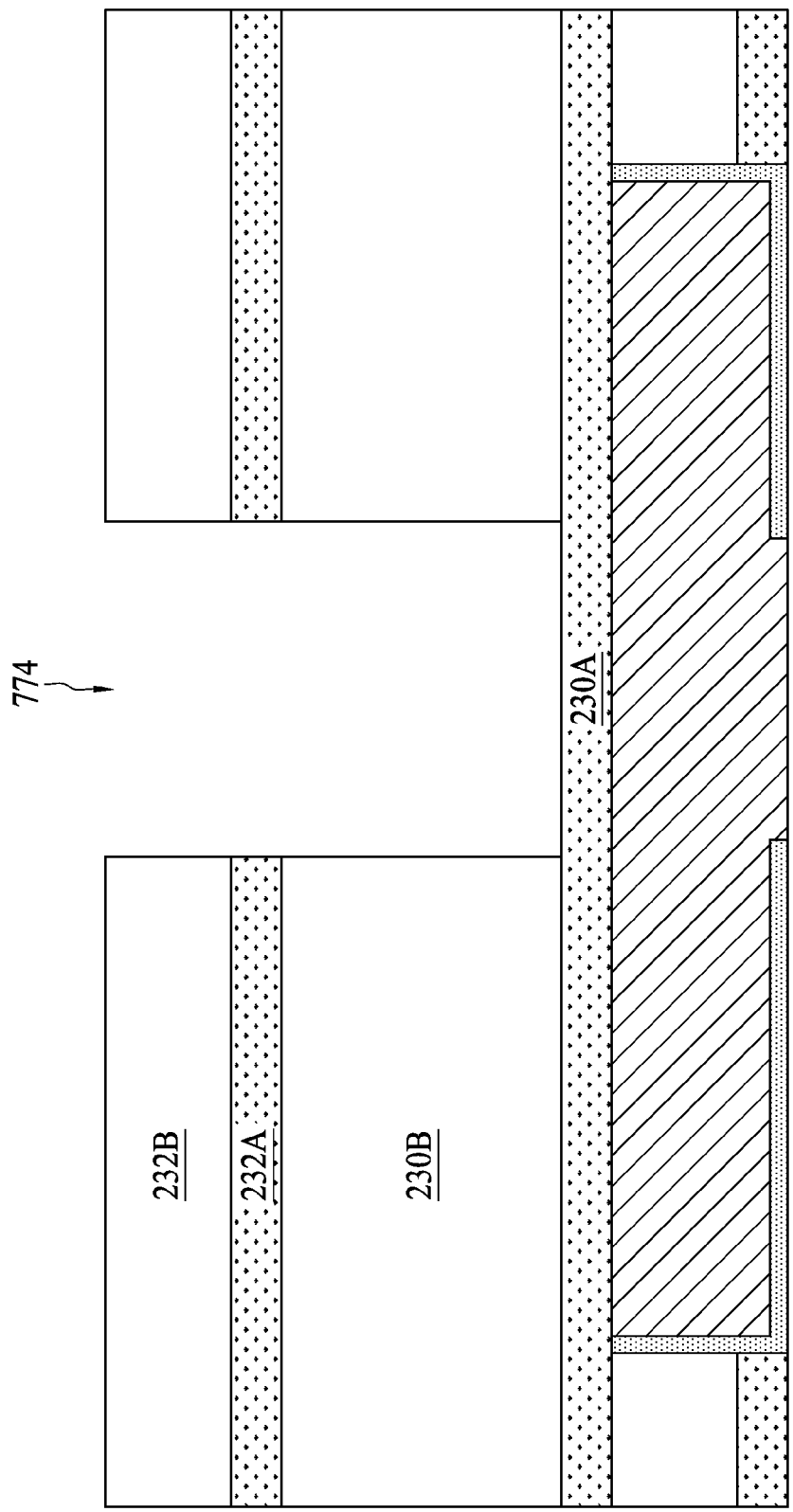
Figure 7D:
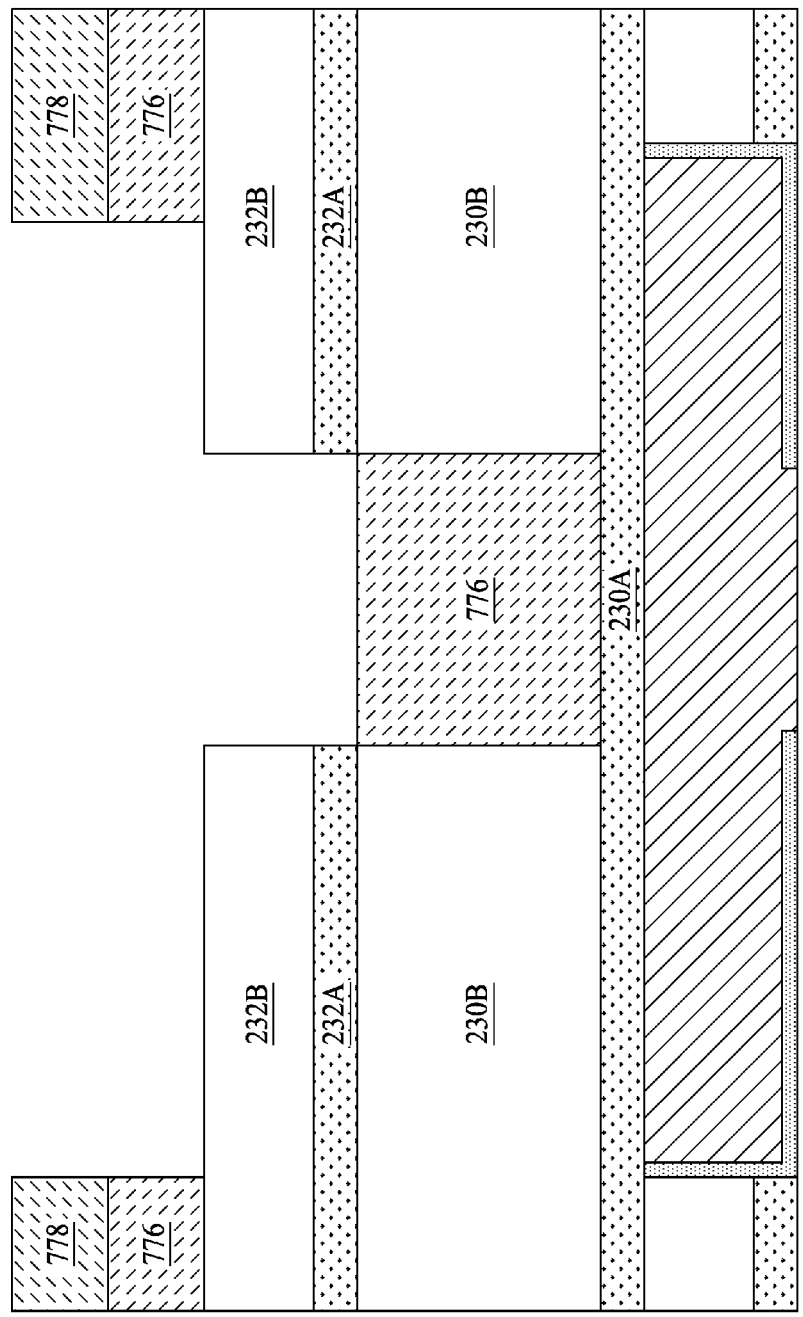

In some embodiments, in FIG. 7D, a bottom-anti-reflective coating (BARC) 776 is blanket deposited on a top surface of the ILD layer 232B and fills the via opening 774 shown in FIG. 7C. The BARC 776 serves as a protective cover over the exposed structure at a bottom of the via opening 774. A photoresist layer 778 is deposited on the BARC 776, and is patterned into a photoresist mask which defines an area where a trench opening 780A (shown in FIG. 7E) is to be present. A portion of the BARC 776 not covered by the photoresist mask is removed using a timed-removal until about the level of the etch stop layer 232A.

Figure 7E:
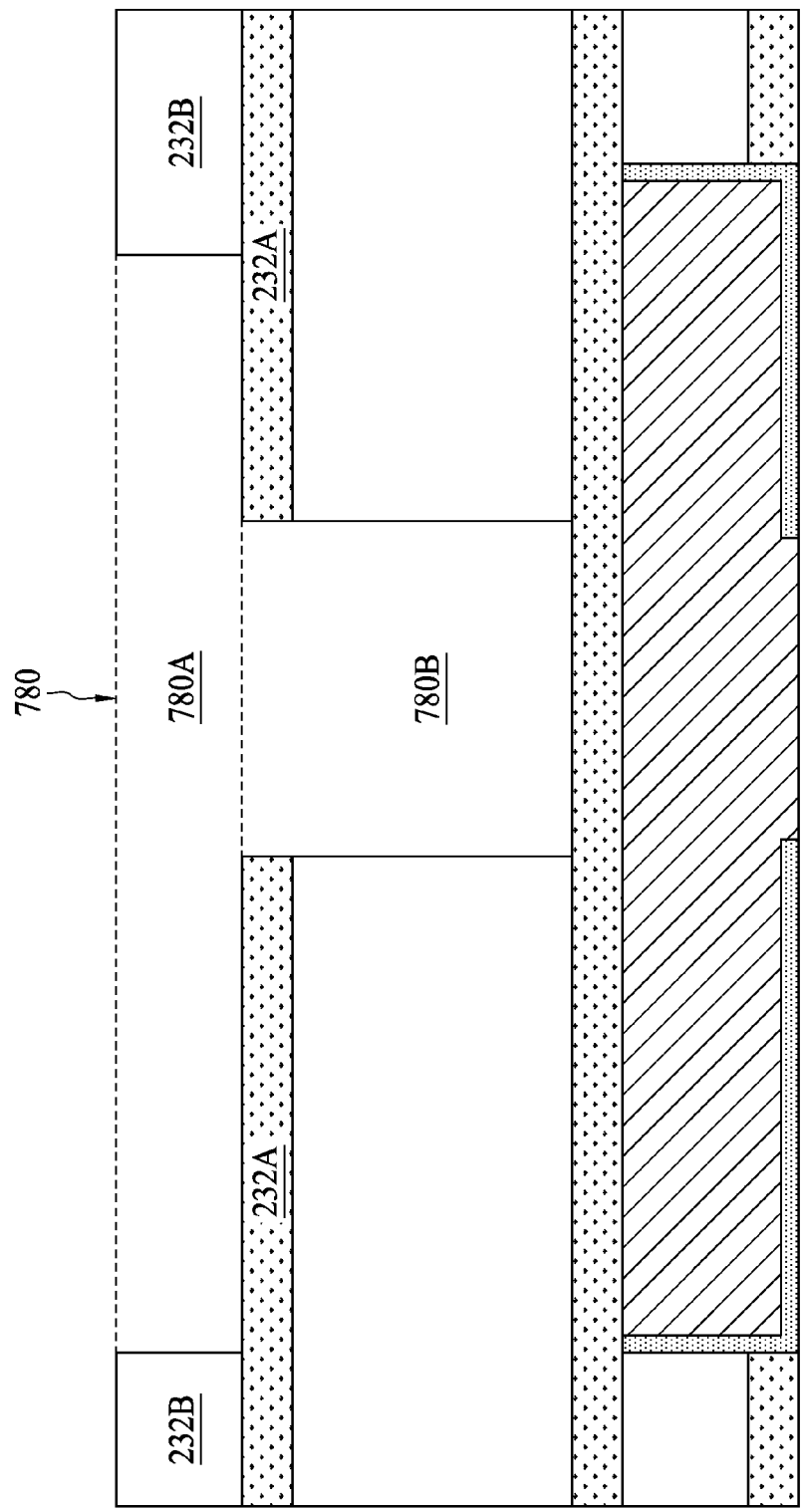

In some embodiments, as shown in FIG. 7E, the pattern of the photoresist layer 778 is then transferred to the ILD layer 232B to form the trench opening 780A. In some embodiments, the ILD layer 232B is etched using a recipe $CF_4/CHF_3$ until the etch stop layer 232A is reached. In addition, the BARC 776 is removed to form a via opening 780B. In some embodiments, the BARC 776 is removed using, for example, a wet-etch solution including $H_2SO_4/H_2O_2$.

Figure 7F:
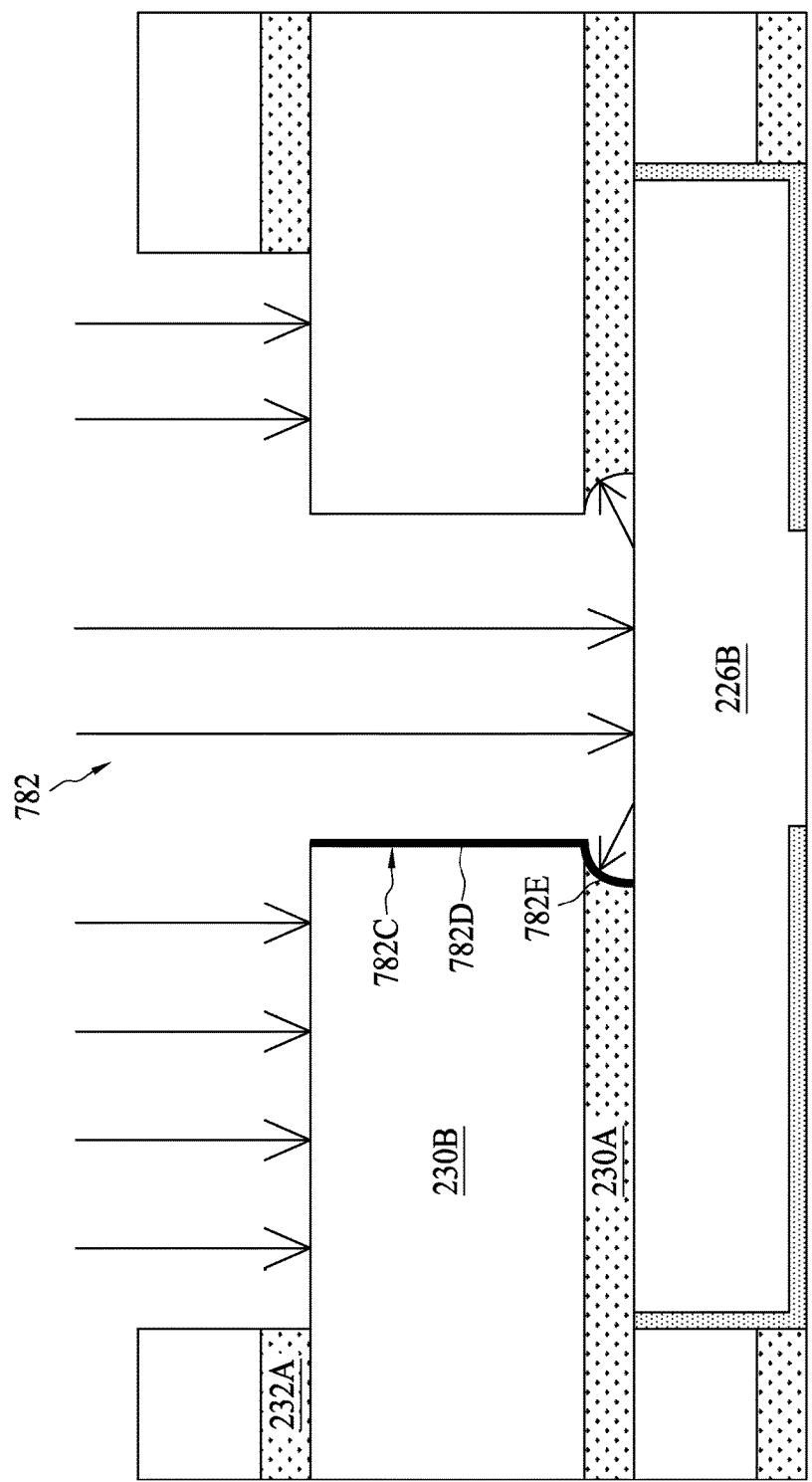

In operation 608, ion bombardment is performed at where the portion of the plurality of dielectric layers is removed such that an opening that exposes the conductive region and has a bottom-notched side wall profile 782C is created. Referring to FIG. 7F, in some embodiments, ion bombardment is performed on a bottom of the trench opening 780A (labeled in FIG. 7E) and a bottom of the via opening 780B (labeled in FIG. 7E) to remove the etch stop layer 232A at the bottom of the trench opening 780A and the etch stop layer 230A at the bottom of the via opening 780B. Furthermore, by adjusting, for example, RF power for ion bombardment, scattered ions from an exposed top surface of the conductive layer 226B cause the etch stop layer 230A to be laterally etched, thereby creating a bottom-notched side wall profile 782C. In some embodiments, the bombarding ions are argon ions. In some embodiments, the RF power is 600 W to 900 W and is combined with an etching amount of 80 Å to 150 Å. The profile of the via opening 780B is optimized through fine tuning the RF power and the etching amount.

Figure 7G:
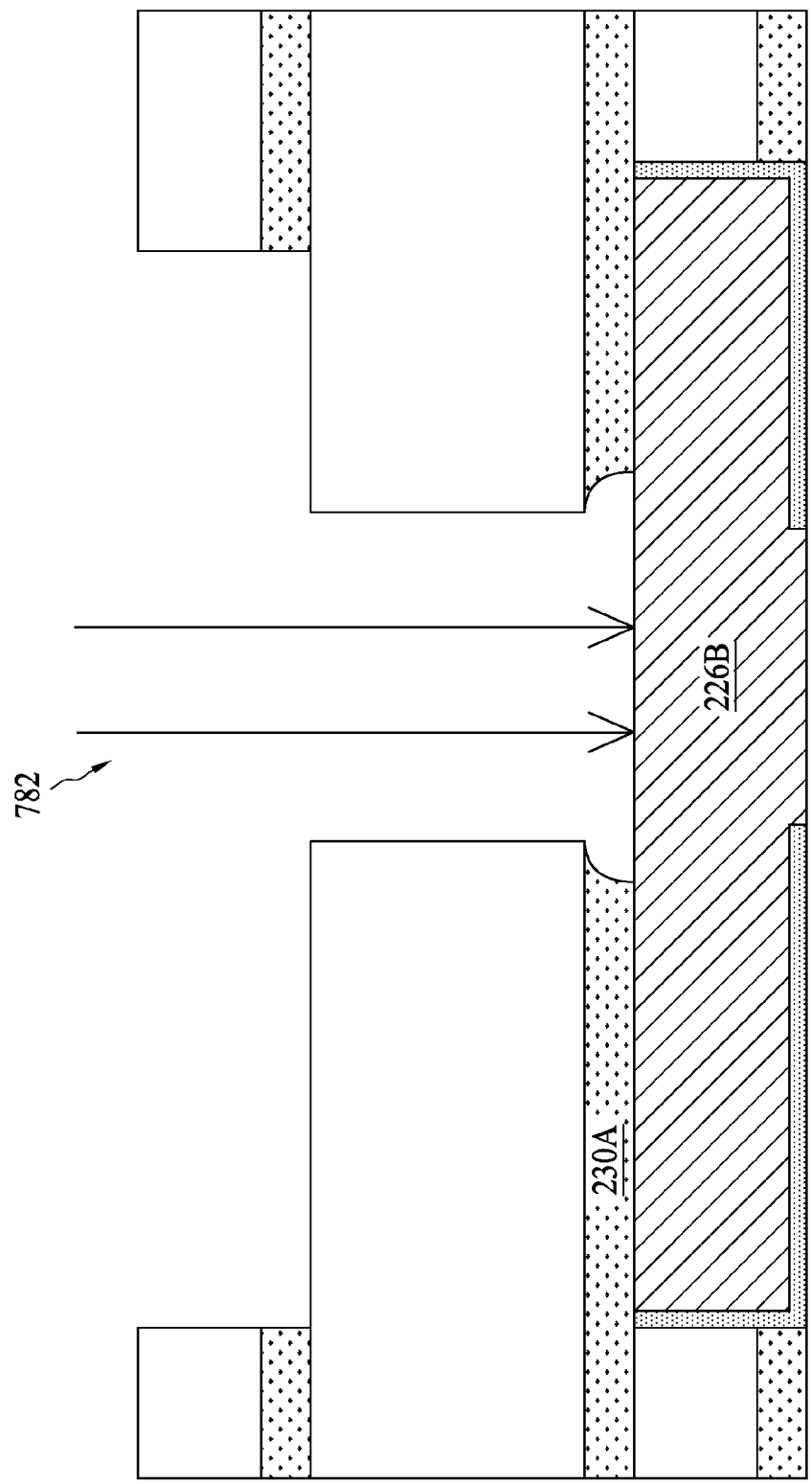

In FIG. 7F, a dual-damascene opening 782 that exposes a top surface of the conductive layer 226B is formed. The bottom-notched side wall profile 782C includes upper sections 782D and lower sections 782E which are notched with respect to the upper sections 782D. At a bottom of the opening 782, a width between the lower sections 782E is at least about 5% more than a width between the upper sections 782D imaginarily extended to the bottom of the opening 782. In some embodiments, the width between the lower sections 782E at the bottom of the opening 782 is about 5%-10% more than the width between the upper sections 782D imaginarily extended to the bottom of the opening. In some embodiments, the opening 782 undercuts the ILD layer 230B In operation 610, a conductive structure filing the opening is formed. When the top surface of the conductive layer 226B is exposed, an oxide of the material of the conductive layer 226B such as copper is formed. As shown in FIG. 7G, before filling the dual-damascene opening 782 with conductive materials, pre-cleaning is performed to remove the oxide on the top surface of the conductive layer 226B. In some embodiments, pre-cleaning is performed using, for example, argon ion bombardment.

Figure 7H:
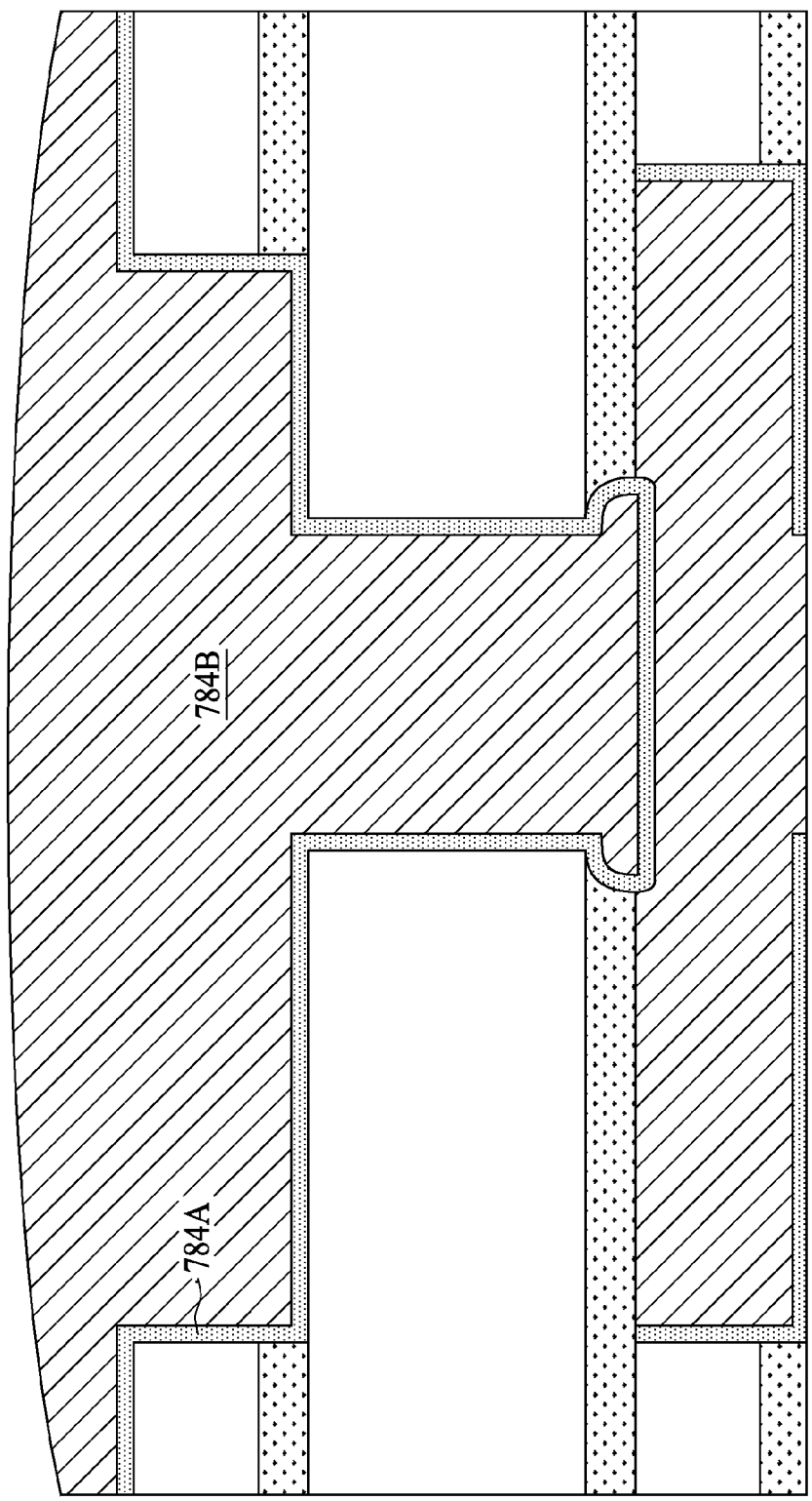

In FIG. 7H, a diffusion barrier layer 784A is conformally deposited on the side walls and the bottom of the dual-damascene opening 782. Exemplary materials for the diffusion barrier layer 784A have been provided above with reference to FIG. 4. In some embodiments, the diffusion barrier layer 784A is deposited using, for example, sputtering. In some embodiments, in order to fill the dual-damascene opening 782 with a conductive material such as copper, a copper seed layer is deposited over the diffusion barrier layer 784A. The copper seed layer is deposited using, for example, sputtering. Then, a copper plating process is performed to fill the dual-damascene opening 782 with the copper 784B. The copper plating process includes, for example, a first copper electroplating or electroless plating process, a copper reflow process, and a second copper electroplating or electroless plating process.

Figure 7I:
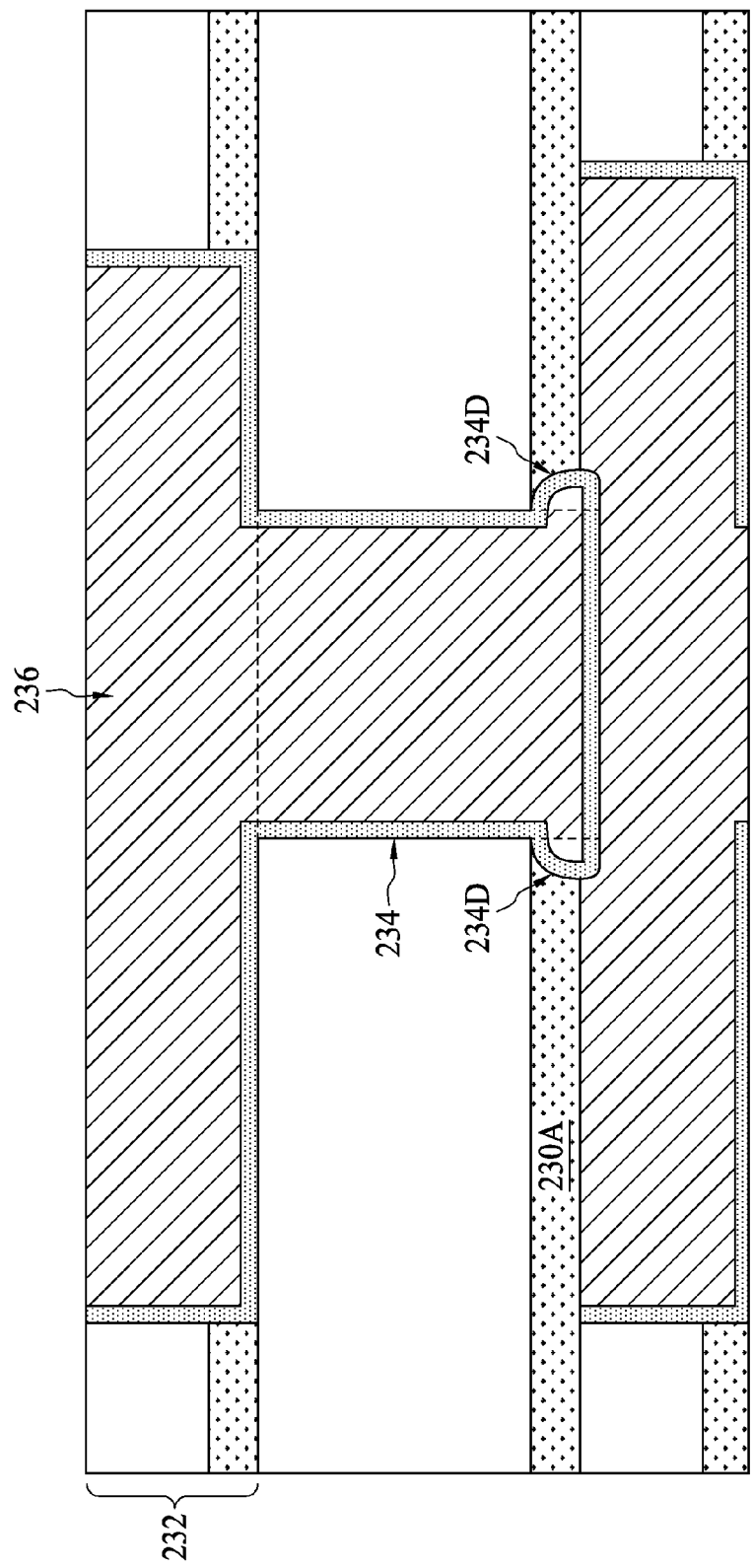

In FIG. 7I, a planarization process such as the CMP process is performed to remove copper 784B (shown in FIG. 7H) beyond a top surface of the stack of dielectric layers 232. A conductive structure that includes the metal layer 236 and the via plug 234 filling the dual-damascene opening 782 is therefore formed in the dual-damascene opening 782 (shown in FIG. 7G). The lower sections 782E in the bottom-notched side wall profile 782C shown in FIG. 7F result in the formation of the footing regions 234D in the dual-damascene opening 782.

Figure 8A:
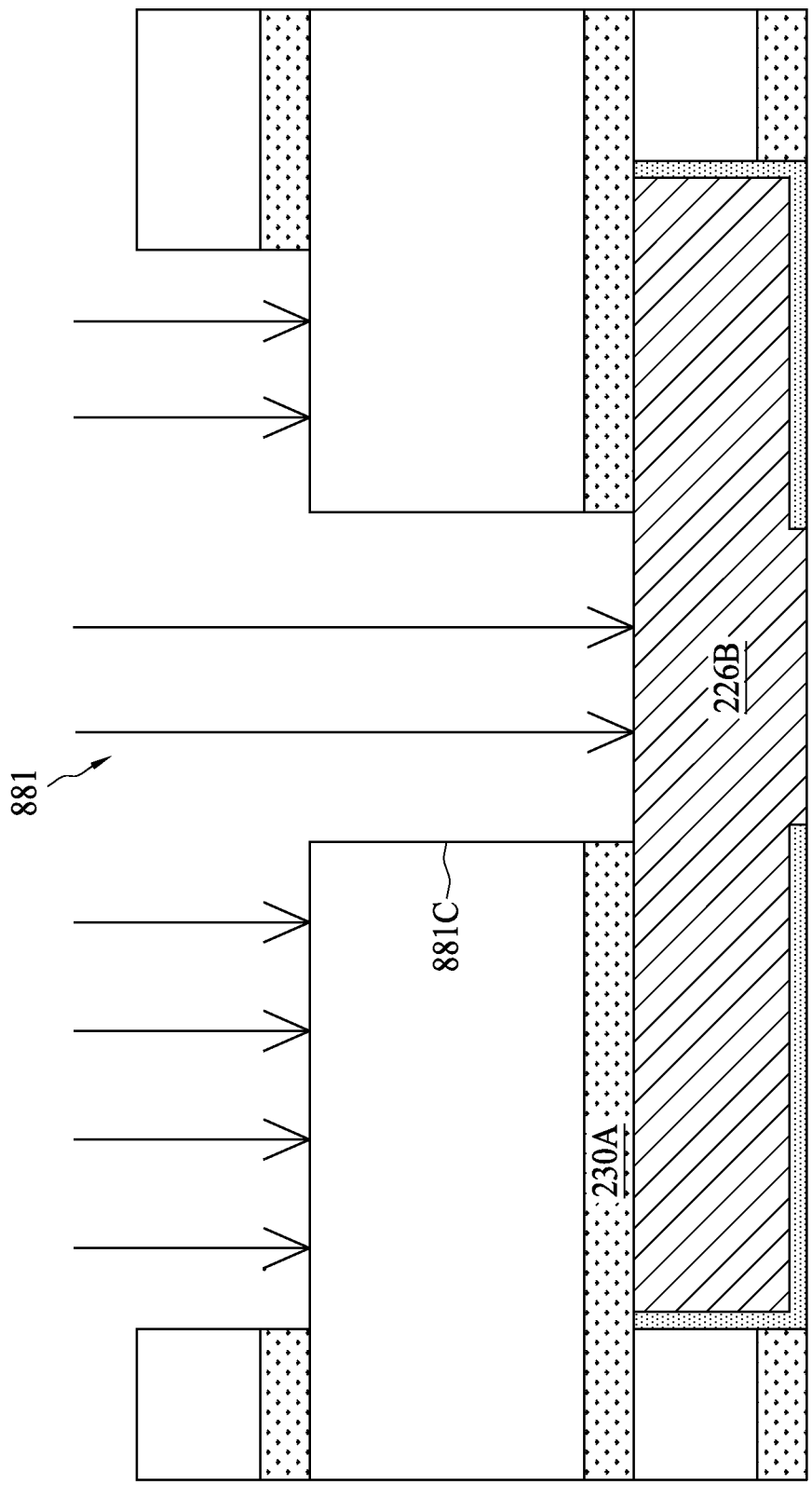
FIGS. 8A to 8B are schematic cross-sectional diagrams of structures formed by operations or sub-operations alternative to those in FIGS. 7F and 7G in accordance with some embodiments.
Figure 8B:
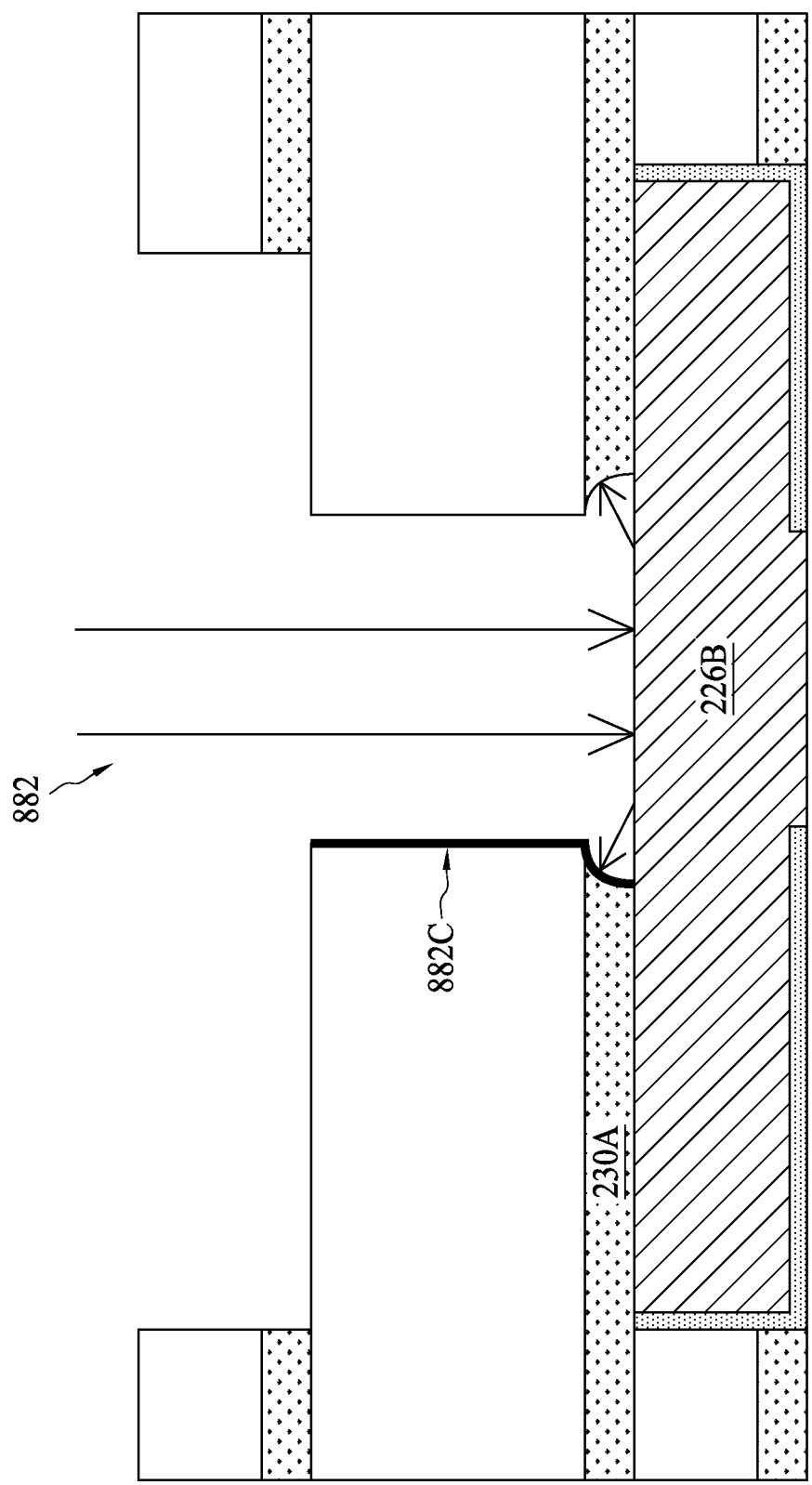

FIGS. 8A to 8B are schematic cross-sectional diagrams of structures formed by operations or sub-operations alternative to those in FIGS. 7F and 7G in accordance with some embodiments. In operation 606, a portion of the plurality of dielectric layers are removed. Compared to the embodiments described with reference to FIG. 7F, in FIG. 8A, the etch stop layer 230A at the bottom of the via opening 780B (shown in FIG. 7E) is removed to expose the conductive layer 226B, but the etch stop layer 230A is not laterally etched. Therefore, the side wall profile 881C is substantially straight. In some embodiments, the etch stop layer 232A is etched physically using argon ion bombardment. In other embodiments, the etch stop layer 232A is etched using RIE.

In operation 608, ion bombardment is performed at where the portion of the plurality of dielectric layers is removed such that an opening that exposes the conductive region and has a bottom-notched side wall profile is created. Compared to the embodiments described with reference to FIG. 7G, in FIG. 8B, when pre-cleaning of the oxide on top surface of the conductive layer 226B is performed using ion bombardment, the RF power for ion bombardment is adjusted such that the etch stop layer 230A is laterally etched, and the bottom-notched side wall profile 882C is created. In some embodiments, the RF power is . . . .

In the embodiments described above, the lower sections of the bottom-notched side wall profile are created using ion bombardment. For the via plugs, or similarly the plug regions of the bond pads, and the contact plugs in the integrated circuit 10 (shown in FIG. 1), because the etching mechanism of the notches of the bottom-notched side wall profile is physical, the side wall profiles of the via plugs, the plug regions of the bond pads and the contact plugs are less subjected to loading effects that can adversely impact uniformity of the side wall profiles of the via plugs, the plug regions of the bond pads and the contact plugs. Therefore, the reliability of the adhesion interfaces of the via plugs, the plug regions of the bond pads and the contact plugs to the underlying conductive regions and to the surrounding etch stop layer are further enhanced. Furthermore, etching of the notches is performed in conjunction with removal of the etch stop layer 230A on the conductive layer 226B shown in FIG. 7F, or pre-cleaning of the dual-damascene opening 782 shown in FIG. 7G, and therefore does not further complicates the process for forming the interconnect structure.

Dual-damascene processes described with references to FIG. 7A to 8B are exemplary. Other processes, such as a single-damascene process or a process for creating just the contact plug or the via plug, are within the contemplated scope of the present disclosure.

In some embodiments, an interconnect structure includes a plug embedded in a stack of dielectric layers and in contact with an underlying conductive region. The stack of dielectric layers includes a passivation layer, an IMD layer or an ILD layer, and an etch stop layer under the passivation layer, the IMD layer or the ILD layer. The plug has footing regions that are formed at least partially in the etch stop layer. The footing regions enhance an adhesion interface between the plug and the underlying conductive region, and between the plug and the surrounding etch stop layer. Furthermore, in some embodiments, notches in side wall profiles of the plugs in the integrated circuit are created using ion bombardment. Therefore, side wall profiles of the plugs with the footing regions are less subjected to loading effects and are more uniform, thereby further ensuring the reliability of the adhesion interface of the plugs to the underlying conductive regions and to the surrounding etch stop layer. In addition, etching of the notches is performed in conjunction with removal of the etch stop player on the conductive region, or pre-cleaning of the opening, and therefore does not further complicates the process for forming the interconnect structure.

In some embodiments, an interconnect structure includes a base layer, a plurality of dielectric layers and a conductive structure. The base layer includes a conductive region. The plurality of dielectric layers are formed over the base layer. The plurality of dielectric layers includes a first dielectric layer and an etch stop layer under the first dielectric layer. The conductive structure includes a plug. The plug includes a central region and one or more footing regions. The footing regions are formed around the central region and formed at least partially in the first etch stop layer. A total width of the central region and one or more footing regions at a bottom level of the plurality of dielectric layers is at least about 5% more than a width of the central region at the bottom level of the plurality of dielectric layers.

In some embodiments, an interconnect structure includes a plurality of dielectric layers, and a conductive structure. The plurality of dielectric layers comprise a lower density layer and a higher density layer under the lower density layer. The conductive structure is formed through the plurality of dielectric layers. The conductive structure includes a plug. The plug includes a central region and one or more footing regions. The one or more footing regions are formed around the central region and formed at least partially in the higher density layer. A total width of the central region and the one or more footing regions at a bottom level of the plurality of dielectric layers is at least about 5% more than a width of the central region at the bottom level of the plurality of dielectric layers.

In some embodiments, in a method, a base layer including a conductive region is provided. A plurality of dielectric layers are formed over the base layer. A portion of the plurality of dielectric layers is removed. Ion bombardment is performed at where the portion of the plurality of dielectric layers is removed such that an opening that exposes the conductive region and has a bottom-notched side wall profile is created. The bottom-notched side wall profile includes an upper section, and a lower section formed under the upper section and notched with respect to the upper section. A width of the lower section at a bottom of the opening is at least about 5% more than a width of the upper section imaginarily extended to the bottom of the opening. A conductive structure filling the opening is formed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An interconnect structure, comprising:
a base layer comprising a conductive region;
a plurality of dielectric layers formed over the base layer, wherein the plurality of dielectric layers comprise a first dielectric layer and an etch stop layer under the first dielectric layer;
a conductive structure through the plurality of dielectric layers and extended into the conductive region, wherein the conductive structure comprises a plug;
the plug comprises:
a central region; and
one or more footing regions formed around the central region and formed partially in the etch stop layer and partially in the conductive region;

a first total width of the central region and the one or more footing regions at a bottom level of the plurality of dielectric layers is at least about 5% more than a width of the central region at the bottom level of the plurality of dielectric layers; and a second total width of the central region and the one or more footing regions largest within the conductive region is equal to or less than the first total width.

2. The interconnect structure of claim 1, wherein each of the one or more footing regions has a side wall profile that tapers toward the central region along an upward direction.

3. The interconnect structure of claim 1, wherein the first total width of the central region and the one or more footing regions at the bottom level of the plurality of dielectric layers is about 5%40% more than the width of the central region at the bottom level of the plurality of dielectric layers.

4. The interconnect structure of claim 1, wherein the conductive region is a metal layer.

5. The interconnect structure of claim 1, wherein the one or more footing regions abut the first dielectric layer.

6. The interconnect structure of claim 5, wherein the etch stop layer comprises silicon carbide; and
the first dielectric layer comprises a material selected from the group consisting of undoped silicate glass and organo-silicate-glass.

7. The interconnect structure of claim 1, wherein the conductive structure further comprises a metal layer formed over the plug.

8. An interconnect structure, comprising:
a base layer comprising a conductive region;
a plurality of dielectric layers formed over the base layer, wherein the plurality of dielectric layers comprise a lower density layer and a higher density layer under the lower density layer;
a conductive structure through the plurality of dielectric layers and extended into the conductive region,
wherein the conductive structure comprises a plug; and
the plug comprises:
    a central region; and
    one or more footing regions formed around the central region and formed partially in the higher density layer and partially in the conductive region;
a first total width of the central region and the one or more footing regions at a bottom level of the plurality of dielectric layers is at least about 5% more than a width of the central region at the bottom level of the plurality of dielectric layers; and
a second total width of the central region and the one or more footing regions largest within the conductive region is equal to or less than the first total width.

9. The interconnect structure of claim 8, wherein each of the one or more footing regions has a side wall profile that tapers toward the central region along an upward direction.

10. The interconnect structure of claim 8, wherein the first total width of the central region and the one or more footing regions at the bottom level of the plurality of dielectric layers is about 5%-10% more than the width of the central region at the bottom level of the plurality of dielectric layers.

11. The interconnect structure of claim 8, wherein the one or more footing regions abut the lower density dielectric layer.

12. The interconnect structure of claim 11, wherein the higher density layer comprises silicon carbide; and
the lower density layer comprises a material selected from the group consisting of undoped silicate glass and organo-silicate-glass.

13. The interconnect structure of claim 8, wherein the conductive structure further comprises a metal layer formed over the plug.

14. An interconnect structure, comprising:
a base layer comprising a conductive region;
a plurality of dielectric layers formed over the base layer, wherein the plurality of dielectric layers comprise a passivation layer and an etch stop layer under the passivation layer;
a bond pad through the plurality of dielectric layers and extended into the conductive region,
wherein the bond pad comprises a plug region;
the plug region comprises:
    a central region; and
    one or more footing regions formed around the central region and formed partially in the etch stop layer and partially in the conductive region;
a first total width of the central region and the one or more footing regions at a bottom level of the plurality of dielectric layers is at least about 5% more than a width of the central region at the bottom level of the plurality of dielectric layers; and
a second total width of the central region and the one or more footing regions largest within the conductive region is equal to or less than the first total width.

15. The interconnect structure of claim 14, wherein the first total width of the central region and the one or more footing regions at a bottom level of the plurality of dielectric layers is about 5%-10% more than the width of the central region at the bottom level of the plurality of dielectric layers.

16. The interconnect structure of claim 14, wherein the conductive region is a metal layer.

17. The interconnect structure of claim 14, wherein the one or more footing regions abut the first dielectric layer.

18. The interconnect structure of claim 16, wherein the etch stop layer comprises silicon carbide; and
the passivation layer comprises a material selected from the group consisting of undoped silicate glass and organo-silicate-glass.

19. The interconnect structure of claim 14, wherein the conductive structure further comprises a pad formed over the plug region.

20. The interconnect structure of claim 14, wherein the plurality of dielectric layers further comprise an adhesion promotion layer under the etch stop layer to enhance adhesion between the etch stop layer and the conductive region; and
the one or more footing regions are further formed partially in the adhesion promotion layer.

* * * * *